United States Patent [19]

Schaefer et al.

[11] Patent Number: 5,062,067
[45] Date of Patent: Oct. 29, 1991

[54] LEVELIZED LOGIC SIMULATOR WITH FENCED EVALUATION

[75] Inventors: Thomas J. Schaefer, Cupertino; Robert D. Shur, Los Altos, both of Calif.

[73] Assignee: VLSI Technology, Inc., San Jose, Calif.

[21] Appl. No.: 324,283

[22] Filed: Mar. 15, 1989

[51] Int. Cl.$^5$ .................. G06F 15/60; G06F 15/20
[52] U.S. Cl. .................... 364/578; 364/488
[58] Field of Search .............. 364/578, 488, 200, 900

[56] References Cited

U.S. PATENT DOCUMENTS

| | | | |
|---|---|---|---|
| 4,697,241 | 9/1987 | Lavi | 364/488 |
| 4,775,950 | 10/1988 | Terada et al. | 364/578 |
| 4,791,593 | 12/1988 | Hennion | 364/578 |
| 4,815,024 | 3/1989 | Lewis | 364/578 |

FOREIGN PATENT DOCUMENTS

| | | | |
|---|---|---|---|
| 60-91455 | 5/1985 | Japan | 364/578 |
| 60-254351 | 12/1985 | Japan | 364/578 |

OTHER PUBLICATIONS

Breuer: Functional Partitioning and Simulation of Digital Circuits, IEEE Transactions on Computers, vol. C-19, No. 11, Nov. 1970, pp. 1038-1046.

*Primary Examiner*—Felix D. Gruber
*Attorney, Agent, or Firm*—Flehr, Hohbach, Test Albritton & Herbert

[57] ABSTRACT

A simulator for a levelized logic circuit reduces the number of evaluations required. The simulator associates certain lists of signals, called fences, with each component of a logic circuit. A fence is evaluated to determine whether it is active or inactive. Active fences contain signals which have charged since a previous evaluation. Components for active fences are then evaluated by the simulator. Fences are formed by starting with a seed set of signals. If all of the input signals to a component are in one or more fences, a final fence for a component is formed which is the union of the one or more fences. Only signals which can cause an output change on a component are included in fences.

12 Claims, 2 Drawing Sheets

LEVELIZED LOGIC SIMULATOR WITH FENCED EVALUATION

BACKGROUND OF THE INVENTION

1. Field of the Invention

This invention relates to logic simulators and, more particularly, to methods of reducing the number of component evaluations required during a logic simulation.

2. Prior Art

Simulation techniques for logic circuits are used to predict changes in the signal values of circuit output signals and internal signals as a function of changes in circuit input signals. A logic circuit is typically described as an interconnected set, or network, or net, of components, such as AND-gates, inverters, and flip-flops. A circuit description can be produced as a list of components or as a list of nets, called a netlist. When describing a circuit as a list of components, each component entry in the list typically includes the name of a component, its function, and a list of inputs and outputs. Each entry in a netlist describes one net which connects two or more component pins of various devices, descriptions of which are stored in a library file. The signal values of interest for a logic circuit are logic values (typically 0, 1 and a few other values) for the circuit's signals, rather than voltages, etc. Logic circuit simulation is usually done on a general-purpose digital computer, although special-purpose machines are increasingly being used.

Event-driven simulation is a common method of logic circuit simulation. An "event" is defined as a change in the signal value or logic value of a signal. When an event occurs, that is, when a signal value changes, all the components for which that signal is an input signal are scheduled for reevaluation in an event-driven simulation system. These reevaluations may cause additional events which, in turn, cause more reevaluations.

Levelized simulation is a second commonly used method of logic simulation. In this method, the components are levelized, that is, the components of a circuit are arranged or ordered in such a way that one component precedes a second component if the one component produces a signal that is an input signal for a second component. The components can then be evaluated in order. Evaluating components in order results in a faster simulation, because unnecessarily repeated evaluations are avoided. There are cases where no such ordering is possible, for example in the case of a feedback loop where one component produces a signal that is an input signal for another component and the other component produces a signal that is an input signal to the first component. Other more complicated feedback loops are also encountered. In the case of feedback loops, special evaluation techniques are used.

A compiled logic-circuit simulator program, as distinguished from an interpreted simulator, converts a circuit description directly into a set of machine-language instructions. These instructions describe the logic functions and interconnection of the components of the circuit. Each component has associated with it a corresponding set of machine language instructions and a corresponding current-value entry in a circuit value table. In contrast, an interpretive simulator program contains a set of tables in which descriptions of the circuit elements are contained. The interpretive simulator operates directly on the set of tables without converting the circuit description to machine language instructions.

Levelized compiled code (LCC) simulation is a form of computed simulation which incorporates a logic circuit description within the program. First, a circuit is levelized, that is, all of the circuit components are ordered as described above. Then a computer program is generated which evaluates all of the components in order. The program is then compiled. During simulation, the program is executed once for each change in the input signals of a circuit. Because the logic circuit description is incorporated into the compiled program, this method results in faster simulations than can be achieved by programs which treat the circuit description as data elements.

A number of techniques for reducing simulation time have been developed to avoid evaluation of every component each time that a circuit input signal changes. Each circuit component can be tested prior to evaluation to determine whether any of its input signals have changed. Other methods rely on knowledge of particular logic circuits. For example, if a circuit is known to be synchronous and if the clock signals for that circuit are available, it is possible to avoid evaluations during inactive phases of the clock signals. For particular circuits, simulation models uniquely suited for simulation can be individually designed.

SUMMARY OF THE INVENTION

It is an object of the invention to provide an improved method for simulation of levelized logic circuits.

In accordance with these and other objects of the invention, a method of simulating a levelized logic circuit is provided which reduces the number of component evaluations required for a simulation. The method includes the step of associating certain lists, or subsets, of signals, called "fences," with the components of a logic circuit. During simulation each of these fences is evaluated to determine whether it is an active or an inactive fence, where activity is defined as whether one or more of the signals in a particular fence has changed since the previous evaluation. The components associated with an inactive fence do not need to be evaluated again and the simulator can efficiently move on to process a component which requires evaluation. If a fence is active, the simulator evaluates the components associated therewith.

The step of associating a fence with certain logic-circuit components further includes selection of a seed, or starting, set of signals. Initially, for each signal of the seed set, a fence is formed consisting of that signal, and the signal is labeled with that fence. Starting from this initial set of fences, additional fences are formed and associated with components and signals, according to a rule which constructs a fence for each component from the fences of the input signals of that component. Seed sets are selected heuristically.

According to a further aspect of the invention, only signals which can cause a component output signal to change are included as part of a fence. They are called "wakeup" signals. For fences with an excessive number of signals, the method is not used. The elements of feedback loops are treated as one component.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Figure 1:
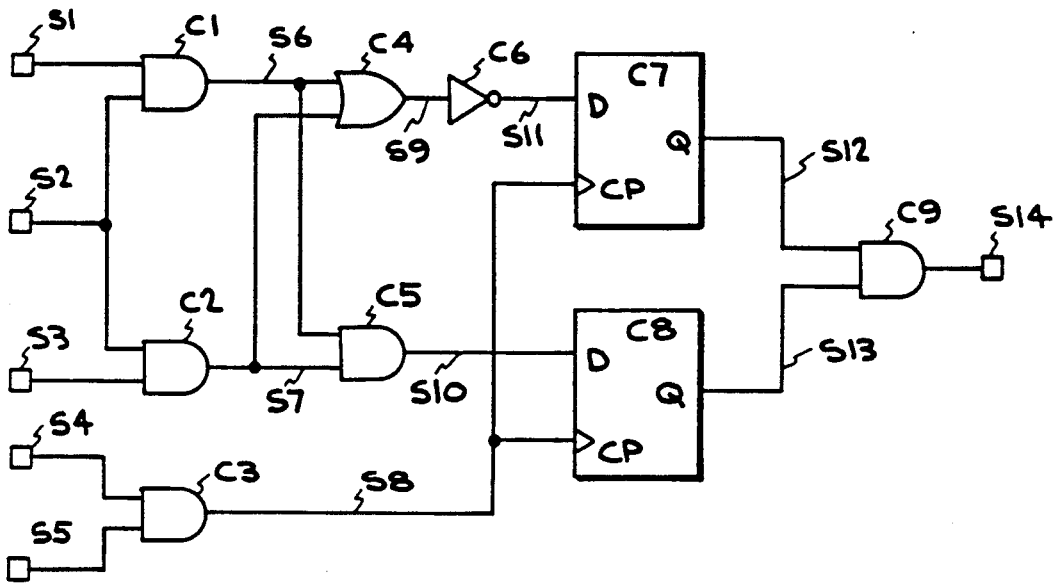
FIG. 1 is a schematic diagram of an exemplary circuit to be simulated in accordance with the invention.

Reference will now be made in detail to the preferred embodiments of the invention, examples of which are illustrated in the accompanying drawings and tables. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

FENCED EVALUATIONS

The method described here relies on "fences." A fence is a list, or a set, of signals. On any given change of circuit inputs, a fence is called "active" if any of the signals in the list changes value as a result of the input change. Otherwise it is called "inactive."

The method assigns fences to the components of a circuit. The method associates a fence with some or all of the components of the circuit. The fence is a list, or a set, of the signals that precede a component in the circuit, such that no change in signal value can propagate from a circuit input to the component without first going through one of the signals of the fence. Thus, if the signals of the fence for a component have not changed for a given change in the circuit inputs, it is not necessary to evaluate that component.

In order for the method to work, the components of the circuit must be ordered, or partially ordered, in such a way that each component gets evaluated only after all of the signals of its associated fence have been evaluated. Thus, in particular, this idea is applicable when simulating with a levelized circuit description.

FENCE CREATION AND PROPAGATION

We now describe our procedure for initially creating, or forming, fences and associating these fences with components. This procedure works on a levelized circuit description and it is extended to other situations as described below. It is assumed that each signal is the output of at most one component. Any circuit can be made to satisfy this assumption by insertion of additional "wired-OR" components which simply represent the joining together of the output signals of two or more components.

The initial creation of fences and their association with components is done as follows:

1. Select a seed set of signals. For each of these signals, create a fence consisting of that signal, and label that signal as having that fence.

2. For every unlabeled component all of whose input signals are labeled, label the component and all unlabeled outputs of that component as follows:

Create a fence whose signal list is the union of the signal lists of the fences of the inputs signals. If a fence consisting of the same set of signals already exists, use it rather than creating a new one.

Label the component with that fence.

Label each unlabeled component output signal with that fence. Note that some of the output signals may already be labeled because they are seeds.

3. Repeat step 2 as long as there are components to which it can apply.

It is possible to group the input signals of a given component into two sets: the "wakeup" input signals and the "non-wakeup" input signals. The non-wakeup input signals have the property that a change on a non-wakeup input signal cannot cause any output signal of the component to change, unless some wakeup input signal also changes. For example, on a commonly used form of edge-triggered flip-flop, the "data" input signal is a non-wakeup input signal and all other input signals are wakeups. For common logic gates such as AND, NOR, etc., all input signals are wakeups.

Since at least one wakeup input signal must change for an evaluation to be required, a fence consisting only of the wakeup input signals of a component is sufficient to determine whether an evaluation is required.

The fence propagation procedure ignores non-wakeup input signals. That is, the component fence is the union of the fences for the wakeup input signals only.

Regarding maximum fence length, it is inefficient to make very long fences (fences having long signal lists) since (1) they slow down the fence propagation procedure, and (2) during simulation it is time-consuming to compute whether or not a very long fence is active. Therefore, when propagating fences through a component, if a new fence would have more than a specified predetermined number of signals, we do not create a fence and do not label the component or its outputs.

Regarding feedback loops, it may be that a subset of the components form a cyclic feedback loop. In this case, the fence propagation procedure described above cannot be used to label any of the components in the loop. Instead, the entire group of signals interconnected by feedback paths is treated as if it were a single component, and the fences of all of the input signals to the feedback group are combined to form a fence for the whole group and its output signals.

SELECTION OF SEED SET OF SIGNALS

The selection of a seed set of signals is based on heuristics. We can use, for example, some subset of the following:

1. Clock signals of storage elements
2. Set/Reset signals of storage elements
3. Output signals of storage elements
4. Signals with large fanout
5. Circuit inputs
6. Signals recommended by circuit designer
7. Signals known from previous simulations to change infrequently.

An optimum fence is one which is associated with a large number of components and which is inactive for a large percent of time. A particularly useful set of seed signals has been one which includes, for example, the primary input signals, all of the clock signals, and flip-flop outputs.

It often happens that multiple signals are derived from a single "root" signal through trees of buffers and/or inverters. Such a tree has the property that a change in the root signal causes every signal in the tree to change, and no signal in the tree ever changes unless the root signal changes. We call such a structure a "buffer-inverter tree." Buffer-inverter trees are commonly used to distribute clocking signals within a circuit. For example, a large number of flip-flops may be clocked by signals from a buffer-inverter tree. We take advantage of buffer-inverter trees in seed selection as follows. Whenever our method of seed selection indicates that a signal in a buffer-inverter tree should be a seed signal, we use the root of the tree as the seed signal in its place. The result of this is that the fences thereby generated tend to be fewer in number and to contain fewer distinct signals. This improves the speed of simulation, since it reduces the time spent in determining which fences are active. Our definition of "inverter" and "buffer" includes not only inverters and buffers proper, but also any other device which is used as such; for example, an AND-gate with all inputs joined together, or a 2-input AND-gate with one input tied to a constant logic high signal.

USING FENCES DURING SIMULATION

1. Evaluate each fence (determine whether or not it is active) as soon as all of the signals in its list have been evaluated.

2. For each component, if it has a fence-label corresponding to a fence that is inactive, skip the evaluation of that component. Otherwise, evaluate that component.

If a number of separate components share a common fence, we can test the common fence once and decide whether to evaluate all or none of the components, instead of testing the fence for each of the separate components.

Components with common fences can be clumped, or grouped together as long as the clumps can be ordered without violating the ordering requirements of the individual components. Information from the levelization step is used to determine when this is possible. One sufficient but not necessary criterion for a group of components to be "clumpable" is that the components are on the same "level" in a levelized circuit description.

EXAMPLE OF FENCE CREATION AND PROPAGATION

FIG. 1 shows a schematic diagram of a circuit. The circuit contains components C1, C2, ..., C9 and signals S1, S2, ..., S14. For convenience, we have numbered the components in a levelized order, that is, if a component drives a signal that is an input to another component, the first component has a lower component number than the second. The levelization order chosen is not unique. It would be possible, for example, to reorder C3 and C4.

Figure 2:
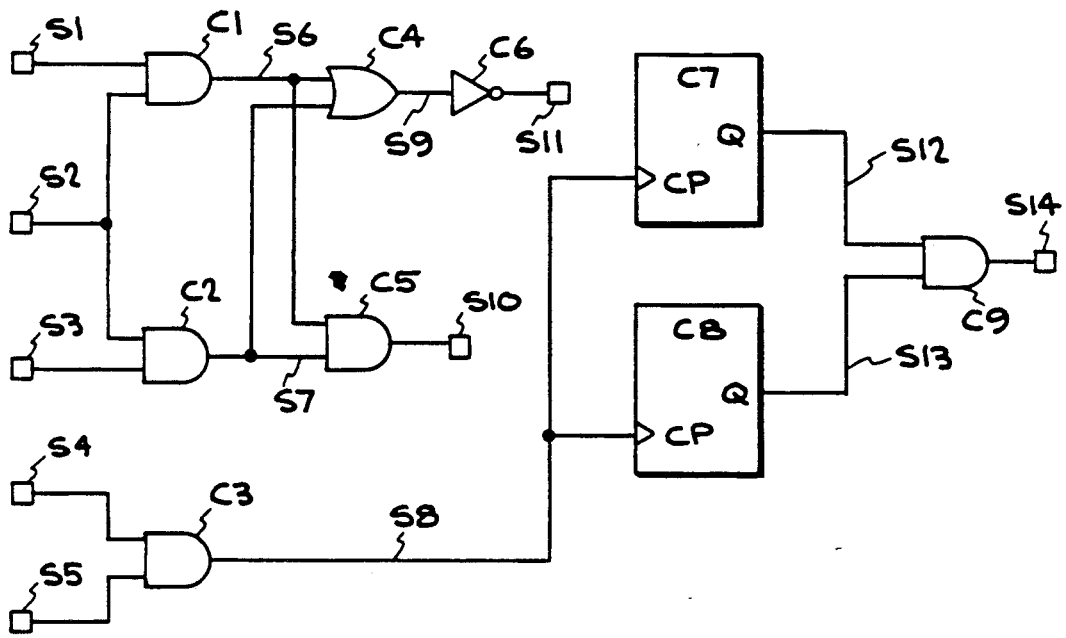
FIG. 2 is a simplified schematic diagram of the circuit of FIG. 1, which has been simplified to eliminate evaluation of certain input signals for certain components.

The data (D) inputs of the two storage element components, C7 and C8, are non-wakeup signals. Thus, for the purpose of both levelization and fence propagation, we use the circuit as pictured in FIG. 2 in place of the circuit in FIG. 1.

As described hereinabove, the selection of a seed set of signals is heuristic. For this example, we have chosen the five circuit input signals (S1, S2, S3, S4, and S5) and the clock signal for the two storage elements (S8). For each seed signal, we create a fence consisting of that signal.

The creation and propagation of fences is illustrated using Tables 1-9. In each table are included 3 lists:

1. Fence/Signal List. This is a list of signals that comprise each fence. Table 1 shows 6 fences, one for each initial seed signal. More fences will be added during the execution of the fence propagation algorithm.

2. Component/Fence Correspondence. This lists each component, and, next to it, the fence associated with that component. Initially, no components have fences associated with them.

3. Signal/Fence Correspondence. This lists each signal, and, next to it, the fence associated with that signal. Initially, only the seed signals have fences associated with them. Except for circuit input signals and seed signals, the fence associated with a signal will be the same as the fence of the component that drives the signal.

TABLE 1

| fence/signal | | component/fence | signal/fence | |
|---|---|---|---|---|
| f1 | s1 | c1 | s1 | f1 |
| f2 | s2 | c2 | s2 | f2 |
| f3 | s3 | c3 | s3 | f3 |
| f4 | s4 | c4 | s4 | f4 |
| f5 | s5 | c5 | s5 | f5 |
| f6 | s8 | c6 | s6 | |
| | | c7 | s7 | |
| | | c8 | s8 | f6 |
| | | c9 | s9 | |
| | | | s10 | |
| | | | s11 | |
| | | | s12 | |
| | | | s13 | |
| | | | s14 | |

Table 1 shows the lists immediately after the selection of seed signals. Succeeding Tables show the lists as they are filled in during execution of the fence propagation algorithm. After selection of the seed signals, the components of the circuit are processed in levelized order. This ensures that the input signals for each component will have been processed before the component. For component C1, the inputs are S1 and S2. These are labeled with fences F1 and F2 respectively. Fence F1 has signal list (S1) and F2 has signal list (S2). The union of these two signal lists is the list (S1,S2). Since there is no already existing fence with that signal list, we create a new fence with that list.

TABLE 2

| fence/signal | | component/fence | | signal/fence | |
|---|---|---|---|---|---|
| f1 | s1 | c1 | f7 | s1 | f1 |
| f2 | s2 | c2 | | s2 | f2 |
| f3 | s3 | c3 | | s3 | f3 |
| f4 | s4 | c4 | | s4 | f4 |
| f5 | s5 | c5 | | s5 | f5 |
| f6 | s8 | c6 | | s6 | f7 |
| f7 | s1.s2 | c7 | | s7 | |
| | | c8 | | s8 | f6 |
| | | c9 | | s9 | |
| | | | | s10 | |
| | | | | s11 | |
| | | | | s12 | |
| | | | | s13 | |
| | | | | s14 | |

Table 2 shows a new fence, F7, with signal list (S1,S2). Component C1 is labeled with the new fence, F7, as is the output of C1, signal S6. The next component is C2. Its inputs are S2 and S3, which have fences F2 and F3. The union of the signal lists for these fences is (S2,S3).

TABLE 3

| fence/signal | | component/fence | | signal/fence | |
| --- | --- | --- | --- | --- | --- |
| f1 | s1 | c1 | f7 | s1 | f1 |
| f2 | s2 | c2 | f8 | s2 | f2 |
| f3 | s3 | c3 | | s3 | f3 |
| f4 | s4 | c4 | | s4 | f4 |
| f5 | s5 | c5 | | s5 | f5 |
| f6 | s8 | c6 | | s6 | f7 |
| f7 | s1,s2 | c7 | | s7 | f8 |
| f8 | s2,s3 | c8 | | s8 | f6 |
| | | c9 | | s9 | |
| | | | | s10 | |
| | | | | s11 | |
| | | | | s12 | |
| | | | | s13 | |
| | | | | s14 | |

As shown in Table 3, we create a new fence, F8, with signal list (S2,S3) and assign F8 to component C2 and to its output signal, S7.

TABLE 4

| fence/signal | | component/fence | | signal/fence | |
| --- | --- | --- | --- | --- | --- |
| f1 | s1 | c1 | f7 | s1 | f1 |
| f2 | s2 | c2 | f8 | s2 | f2 |
| f3 | s3 | c3 | f9 | s3 | f3 |
| f4 | s4 | c4 | | s4 | f4 |
| f5 | s5 | c5 | | s5 | f5 |
| f6 | s8 | c6 | | s6 | f7 |
| f7 | s1,s2 | c7 | | s7 | f8 |
| f8 | s2,s3 | c8 | | s8 | f6 |
| f9 | s4,s5 | c9 | | s9 | |
| | | | | s10 | |
| | | | | s11 | |
| | | | | s12 | |
| | | | | s13 | |
| | | | | s14 | |

Table 4 shows the result of processing component C3 by the fence - propagating algorithm. C3 has inputs S4 and S5, with fences F4 and F5. The union of the signal lists for these fences is (S4,S5). We create a new fence, F9, with signal list (S4,S5) and assign F9 to component C3. The output signal of C3 is S8, which already has a fence assigned (F6) since it is a seed signal.

TABLE 5

| fence/signal | | component/fence | | signal/fence | |
| --- | --- | --- | --- | --- | --- |
| f1 | s1 | c1 | f7 | s1 | f1 |
| f2 | s2 | c2 | f8 | s2 | f2 |
| f3 | s3 | c3 | f9 | s3 | f3 |
| f4 | s4 | c4 | f10 | s4 | f4 |
| f5 | s5 | c5 | | s5 | f5 |
| f6 | s8 | c6 | | s6 | f7 |
| f7 | s1,s2 | c7 | | s7 | f8 |
| f8 | s2,s3 | c8 | | s8 | f6 |
| f9 | s4,s5 | c9 | | s9 | f10 |
| f10 | s1,s2,s3 | | | s10 | |
| | | | | s11 | |
| | | | | s12 | |
| | | | | s13 | |
| | | | | s14 | |

Table 5 shows the result of processing component C4 by the fence - propagating algorithm. The inputs of C4 are S6 and S7, which have fences F7 and F8. The union of the signal lists of these fences is (S1,S2,S3). We create a new fence, F10, with this signal list, and assign it to C4 and its output signal, S9.

TABLE 6

| fence/signal | | component/fence | | signal/fence | |
| --- | --- | --- | --- | --- | --- |
| f1 | s1 | c1 | f7 | s1 | f1 |
| f2 | s2 | c2 | f8 | s2 | f2 |
| f3 | s3 | c3 | f9 | s3 | f3 |
| f4 | s4 | c4 | f10 | s4 | f4 |
| f5 | s5 | c5 | f10 | s5 | f5 |
| f6 | s8 | c6 | | s6 | f7 |
| f7 | s1,s2 | c7 | | s7 | f8 |
| f8 | s2,s3 | c8 | | s8 | f6 |
| f9 | s4,s5 | c9 | | s9 | f10 |
| f10 | s1,s2,s3 | | | s10 | f10 |
| | | | | s11 | |
| | | | | s12 | |
| | | | | s13 | |
| | | | | s14 | |

Table 6 shows the result of processing component C5 by the fence - propagating algorithm. The inputs are S6 and S7 (as for C4 above). The union of the signal lists for the associated fences is (S1,S2,S3). As there is already a fence, F10, with this signal list, we do not create a new fence, but instead reference the existing fence. We assign fence F10 to component C5 and its output signal, S10.

TABLE 7

| fence/signal | | component/fence | | signal/fence | |
| --- | --- | --- | --- | --- | --- |
| f1 | s1 | c1 | f7 | s1 | f1 |
| f2 | s2 | c2 | f8 | s2 | f2 |
| f3 | s3 | c3 | f9 | s3 | f3 |
| f4 | s4 | c4 | f10 | s4 | f4 |
| f5 | s5 | c5 | f10 | s5 | f5 |
| f6 | s8 | c6 | f10 | s6 | f7 |
| f7 | s1,s2 | c7 | | s7 | f8 |
| f8 | s2,s3 | c8 | | s8 | f6 |
| f9 | s4,s5 | c9 | | s9 | f10 |
| f10 | s1,s2,s3 | | | s10 | f10 |
| | | | | s11 | f10 |
| | | | | s12 | |
| | | | | s13 | |
| | | | | s14 | |

Component C6 has a single input, S9, which has fence F10 by the fence - propagating algorithm. Since there is only one fence involved, taking the union of the signal lists will, of course, give the signal list of that fence. Thus, as shown in Table 7, we assign Fence F10 to component C6 and its output signal, S11.

TABLE 8

| fence/signal | | component/fence | | signal/fence | |
| --- | --- | --- | --- | --- | --- |
| f1 | s1 | c1 | f7 | s1 | f1 |
| f2 | s2 | c2 | f8 | s2 | f2 |
| f3 | s3 | c3 | f9 | s3 | f3 |
| f4 | s4 | c4 | f10 | s4 | f4 |
| f5 | s5 | c5 | f10 | s5 | f5 |
| f6 | s8 | c6 | f10 | s6 | f7 |
| f7 | s1,s2 | c7 | f6 | s7 | f8 |
| f8 | s2,s3 | c8 | f6 | s8 | f6 |
| f9 | s4,s5 | c9 | | s9 | f10 |
| f10 | s1,s2,s3 | | | s10 | f10 |
| | | | | s11 | f10 |
| | | | | s12 | f6 |

TABLE 8-continued

| fence/<br>signal | component/<br>fence | signal/<br>fence |
|---|---|---|
| | | s13  f6 |
| | | s14 |

Table 8 shows the result of processing components C7 and C8 by the fence - propagating algorithm. Recall that the data (D) input is a non-wakeup signal and is ignored for the purpose of fence propagation. Thus, for both of these components, the only significant input signal is S8. As above, for a component with a single input, we simply assign the fence of the input signal to the component and its output. In this case, S8 has fence F6, which is assigned to C7 and C8 and their outputs, S12 and S13.

TABLE 9

| fence/<br>signal | | component/<br>fence | | signal/<br>fence | |
|---|---|---|---|---|---|
| f1 | s1 | c1 | f7 | s1 | f1 |
| f2 | s2 | c2 | f8 | s2 | f2 |
| f3 | s3 | c3 | f9 | s3 | f3 |
| f4 | s4 | c4 | f10 | s4 | f4 |
| f5 | s5 | c5 | f10 | s5 | f5 |
| f6 | s8 | c6 | f10 | s6 | f7 |
| f7 | s1,s2 | c7 | f6 | s7 | f8 |
| f8 | s2,s3 | c8 | f6 | s8 | f6 |
| f9 | s4,s5 | c9 | f6 | s9 | f10 |
| f10 | s1,s2,s3 | | | s10 | f10 |
| | | | | s11 | f10 |
| | | | | s12 | f6 |
| | | | | s13 | f6 |
| | | | | s14 | f6 |

Finally, Table 9 shows the result of processing component C9 by the fence - propagating algorithm. It has input signals S12 and S13, both of which are labeled with fence F6. Again, since there is only a single fence involved, we label the component and its output, S14, with that fence.

Since there are no components left to process, the fence propagation algorithm is complete.

EXAMPLE OF USING FENCES DURING SIMULATION

Levelized simulation can be done in a number of ways. The most common is to write code based on the levelized netlist and compile it: hence the term Levelized Compiled Code (LCC) Simulation. The code that is written is a functional simulation model for the circuit being simulated. Typically, the code is essentially a list of evaluations to be performed, one evaluation for each component, with the evaluations listed in levelized order. Thus, for the circuit shown in FIG. 1, the functional simulation model is:
begin
eval(c1);
eval(c2);
eval(c3);
eval(c4);
eval(c5);
eval(c6);
eval(c7);
eval(c8);
eval(c9);
end
Use of fences make it possible to avoid evaluating some of the components. A fence is said to be "active" if any one of the signals in its signal list is active. A signal is considered active if its value has changed since the previous evaluation of the circuit.

We use fences by including in the functional simulation model:
1. Statements to compute whether or not a fence is active.
2. Statements making the evaluation of a component conditional upon its fence being active.

The evaluation of a fence, that is, determination of whether a fence is active or not, like the evaluation of a component, is done only after the signals on which the fence depends have been evaluated. Therefore, a fence must be evaluated after the components which drive the signals included in the fence's signal list are evaluated. To be useful, a fence must be evaluated before the components that are labeled with that fence are evaluated. One way to guarantee that both of these conditions are met is to evaluate a fence immediately before the first component that is labeled with that fence is evaluated.

We assume that there is a variable fi for each fence, Fi. A procedure evalFence(fi), or eF(fi), sets the value of variable fi to true if fence Fi is active and to false otherwise.

For the circuit in FIG. 1, we generate the following functional simulation model:
begin
eF(f7);
if f7 then eval(c1);
eF(f8);
if f8 then eval(c2);
eF(f9);
if f9 then eval(c3);
eF(f10);
if f10 then eval(c4);
if f10 then eval(c5);
if f10 then eval(c6);
eF(f6);
if f6 then eval(c7);
if f6 then eval(c8);
if f6 then eval(c9);
end.

As mentioned previously, it is more efficient to clump evaluations which are conditioned on a common fence. Our model could be written as follows:
begin
ef(f7);
if f7 then eval(c1);
ef(f8);
if f8 then eval(c2);
ef(f9);
if f9 then eval(c3);
ef(f10);
if f10 then
  begin
  eval(c4);
  eval(c5);
  eval(c6);
  end;
ef(f6);
if f6 then
  begin
  eval(c7);
  eval(c8);
  eval(c9);
  end;
end.

In general, the clumping may not be as straightforward as in this example, since for a given fence the components which are conditioned on that fence may not appear next to each other in levelized order. However, the component evaluation order can be rearranged to facilitate clumping so long as the rearrangement does not violate the levelization rule that one component must precede another if the first component drives a signal that is an input to the second component. Generally, components at the same "logic level," i.e., the same number of stages from the circuit inputs, can be reordered arbitrarily. Thus, component evaluations can be clumped at least to the extent that components are on the same logic level.

Figure 3:
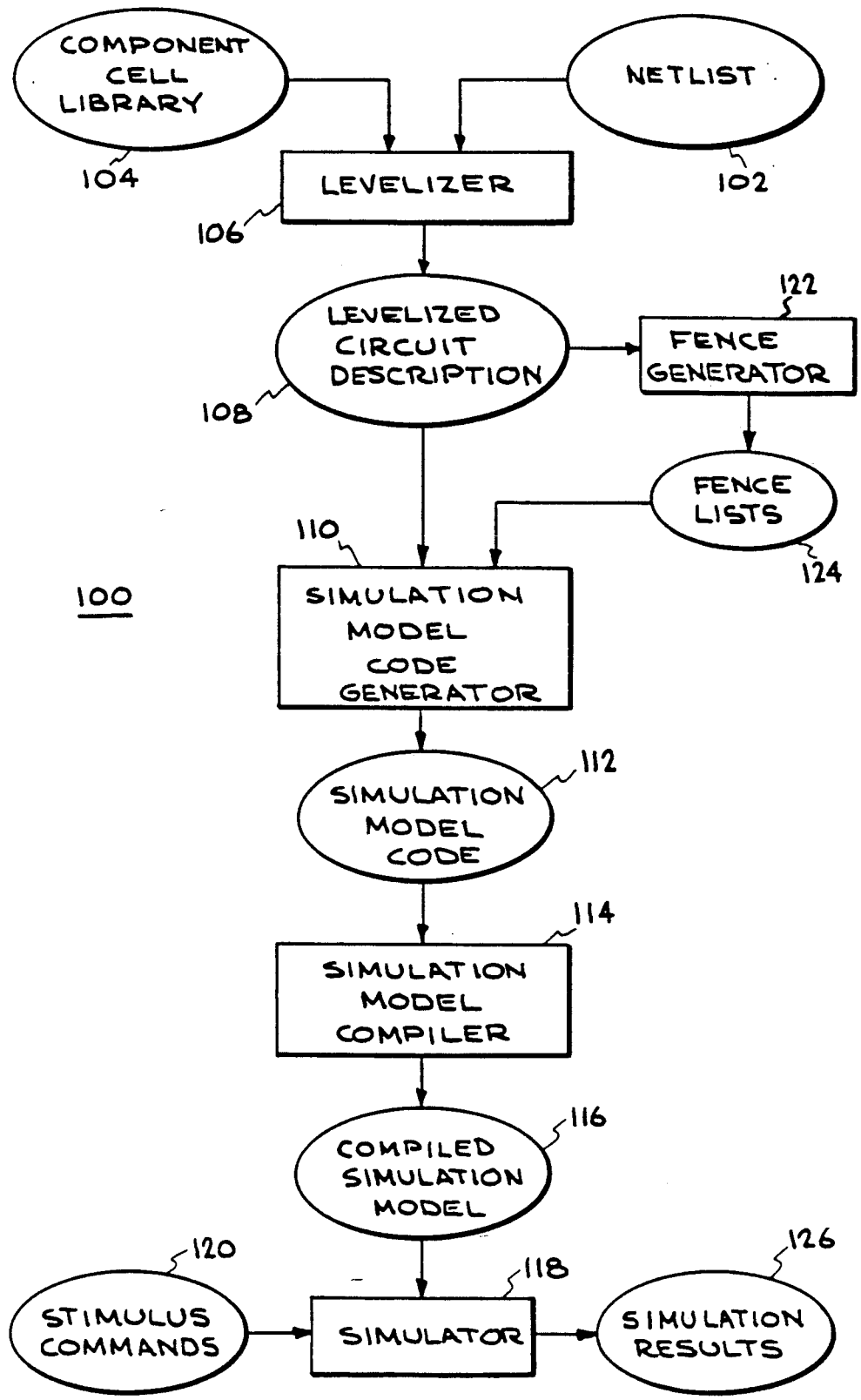
FIG. 3 is a Process Block Diagram for performing a simulation of a levelized logic circuit according to the invention.

FIG. 3 shows a process block diagram 100 showing various data sets as well as functions and instruction for performing a simulation of a logic circuit. The components and their interconnections are represented in a netlist 102 while the characteristics of the components are contained in a component cell library table 104. A levelizer 106 orders the components such that one component precedes a second component if the one component produces a signal that is an input signal to the second component. A levelized circuit description 108 is provided by the levelizer 106. In the prior art this levelized circuit description would be fed into a simulation code generator 110 which generates a simulation model code 112. As explained previously, this code 112 is a list of evaluations to be performed for each component. This code 112 is then compiled in a compiler 114 to produce a levelized compiled code LCC model 116 for the logic circuit being evaluated. The LCC is then processed in a simulator 118 with appropriate stimulus commands 120 being supplied to produce simulation results 126. However, addition of a fence generator function 122, as described hereinabove to produce the fence lists 124 make it possible to avoid evaluating all of the components of a logic circuit. The simulator 118 evaluates only those components which have "active" fences. Components whose fences are inactive are skipped thereby saving time.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A method of improving the efficiency of operation of a computer simulation for a levelized logic circuit in a levelized logic-circuit simulation program, said logic circuit having a number of nodes between which are connected circuit components, each of said nodes having a signal present thereat with the value of said signal indicating the state of said node, comprising the steps of:
    forming a list in memory, which list associates various subsets of signals with each of the components in said circuit;
    labeling each of said associated subsets of signals with a fence;
    evaluating each fence, during simulation by the computer, to determine whether the fence is active, that is, whether the value of one or more of the signals in the fence has changed in value since a previous evaluation; and
    simulating said levelized logic circuit, wherein each step of simulating includes evaluating only those components having a fence that is active.

2. The method of claim 1 wherein the steps of associating and labeling includes the steps of:
    selecting a seed set of signals;
    for each signal of said seed set forming a fence consisting of that signal and labelling that signal as having that fence;
    for each component which has all of its input signals in one or more fences, labeling that component and all unlabeled output signals of that component in accordance with the following steps:
        forming a fence whose signal list is the union of the fences of the input signal;
        labeling that component with that fence; and
        labeling each unlabeled output signal of that component with that fence.

3. The method of claim 2 wherein the step of forming a fence from the union of Fences includes using only input signals which cause a component output signal to change.

4. The method of claim 2 including the step of not forming a fence if the number of signals for a fence exceeds a predetermined number.

5. The method of claim 2 wherein the step of selecting a seed set of signals includes selecting said seed set heuristically.

6. The method of claim 2 including the step of using a root signal of a buffer-inverter tree as a seed signal for the tree.

7. The method of claim 2 wherein said seed set of signals includes signals from the input clock signals of storage components.

8. The method of claim 2 wherein said seed set of signals includes signals selected from the set/reset signals of storage components.

9. The method of claim 2 wherein said logic circuit includes a plurality of storage elements, and said seed set of signals includes signals selected from the output signals of storage elements.

10. The method of claim 2 wherein said seed set of signals includes signals selected from the signals connected to the largest number of said components.

11. The method of claim 2 wherein said logic circuit has a set of primary input signals, and said seed set of signals includes signals selected from said primary input signals.

12. The method of claim 2 wherein said seed set of signals is selected from the signals which change relatively infrequently.

* * * * *